(12) United States Patent
Morigami

(10) Patent No.: US 6,448,849 B1
(45) Date of Patent: Sep. 10, 2002

(54) SEMICONDUCTOR DEVICES INCLUDING A SWITCH MOUNTED THEREON AND A MODULE LOADED WITH THE SAME

(75) Inventor: Seiichi Morigami, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/551,401

(22) Filed: Apr. 17, 2000

(30) Foreign Application Priority Data

Apr. 16, 1999 (JP) ............................................. 11-109563

(51) Int. Cl.[7] ............................................. H01L 25/00
(52) U.S. Cl. ............................................. 327/566
(58) Field of Search ................................ 327/564–566; 326/41

(56) References Cited

U.S. PATENT DOCUMENTS 4,808,844 A * 2/1989 Ozaki et al. ................. 327/566
5,808,897 A * 9/1998 Miller, Jr. et al. ............. 326/41

FOREIGN PATENT DOCUMENTS

| JP | 4-213293 | 8/1992 |
| JP | 6-232604 | 8/1994 |

* cited by examiner

Primary Examiner—Kenneth B. Wells
(74) Attorney, Agent, or Firm—McGinn & Gibb, PLLC

(57) ABSTRACT

A semiconductor chip of the present invention is provided with a switching means which connects a first signal terminal to a first internal signal wiring in response to a control terminal being in a first state, connects the first signal terminal to a second internal signal wiring different from the first internal signal wiring in response to the control terminal being in a second state different from the first state, and connects a second signal terminal to the first internal signal wiring. Since it is possible to switch the function of the first signal terminal and the function of the second signal terminal, wiring within a package is facilitated.

3 Claims, 8 Drawing Sheets

SEMICONDUCTOR DEVICES INCLUDING A SWITCH MOUNTED THEREON AND A MODULE LOADED WITH THE SAME

BACKGROUND OF THE INVENTION

1. Field of the Invention

The present invention relates to semiconductor devices and a module loaded with the same and more particularly to semiconductor devices that are effective when they are mutually mounted on both sides of a substrate and a module loaded with the same.

2. Description of the Related Art

Semiconductor devices, especially semiconductor memories represented by DRAMs, are often mounted on both sides, not only on one side, of a substrate.

Examples of them are what are called a dual in-line memory module (DIMM) and a Rambus in-line Memory module (RIMM).

As is well known, in the DIMM or the RIMM a plurality of synchronous DRAMs (SDRAMs) or Rambus DRAMs (RDRAMs) are mounted on both sides of a substrate. Thus, for example 16 RDRAMs are mounted on one substrate to be used as a memory module having a memory capacity 16 times as large as that of a single RDRAM.

However, in such a module, there arise the following problems that occur hardly in a module (for example, a single in-line memory module (SIMM)) in which semiconductor devices are mounted only on its one side. This will be illustrated by referring to FIG. 5 and FIG. 6.

In FIG. 5 showing a part of a memory module loaded with a plurality of RDRAMs on a substrate 70, only three RDRAMs 72, 74 and 76, out of a plurality of them, are illustrated. On the substrate 70 a plurality of wirings are formed as well. In FIG. 5, however, only a wiring 78 connected to the terminals P of the RDRAMs 72, 74 and 76 is shown. Here, the RDRAMs 72, 74 and 76 are chip scale packages (CSPs) with identical configuration in which RDRAM chips with identical constitution are respectively implemented.

When a signal (for example, an address signal or one of various kinds of control signal) is input to terminals 72-P, 74-P and 76-P of the RDRAMs 72, 74 and 76 through the wiring 78, if it is assumed that the signal is supplied in the direction of an arrow in FIG. 5, the signal arrives first at the terminal 72-P, next at the terminal 76-P and then at the terminal 74-P. Now terminals 72-Q, 74-Q and 76-Q of the RDRAMs 72, 74 and 76 also receive a prescribed signal through a wiring which is not shown. It is noted that terminals 72-P, 74-P and 76-P of the RDPAMs 72, 74 and 76 transmits the same signal, for example, an address signal. and terminals 72-Q, 74-Q and 76-Q of the RDRAMs 72, 74 and 76 transmits the same signal different from the signals transmitted at that terminals 72-P, 74-P and 76-P, for example, a data signal or a control signal. If it is also assumed that this signal is supplied also in the direction of the arrow in FIG. 5, the signal arrives first at the terminal 72-Q, next at the terminal 76-Q, then at the terminal 74-Q. Namely, although the order of arrival of the signal is the same as that of the signal impressed to the terminals 72-P, 74-P and 76-P, the timing of arrival of the signal is different for each RDRAM. In other words, when a signal to be applied to the terminals P and a signal to be applied to the terminals Q of respective RDRAMs are supplied simultaneously in the direction of the arrow, for the RDRAMs 72 and 74, the timings are such that the signal arrives at the terminals 72-Q and 74-Q after its arrival at the terminals 72-P and 74-P, whereas for the RDRAM 76, the signal arrives at the terminal 76-P after its arrival at the terminal 76-Q.

As in the above, in a module where semiconductor devices are loaded on both sides of the substrate, the arrival timings of the signal are different for the semiconductor devices on one side of the substrate and for the semiconductor devices loaded on the other side of the substrate, which has been a factor for the reduction of the margin in the setup/hold time or the like.

It is to be noted that the problem of shift in the timings occurs not only in a signal supplied to each semiconductor device, but also in a signal output from each semiconductor device.

The above problem can be resolved by packaging semiconductor chips of identical configuration into two kinds of packages having mutually different terminal arrangements, then loading one kind of packages on one side of the substrate, and loading the other kind of packages on the other side of the substrate. Namely, what is needed is to make the terminal arrangement of the packages to be loaded on one side of the substrate to be symmetric with the terminal arrangement of the packages to be loaded on the other side of the substrate. The two kinds of packages are in a relation of the left and right hands, so that when they face with each other, that is, when they are loaded on both sides of the substrate, the terminal positions of both kinds of packages match precisely. The two kinds of packages with such a property are called respectively a normal type and a mirrored type, and the mirrored type package has a terminal arrangement which is the mirror reflection of that of the normal type package. as the name suggests.

The circumstance by which the above problem can be resolved by the use of the normal type and the mirrored type packages will be described by reference to FIG. 6. In FIG. 6, the RDRAMs 72 and 74 are normal type CSPs and the RDRAM 80 is a mirrored type CSP.

As shown in the figure, the arrangement of the terminals P and Q in the RDRAM 80 is opposite to that in the RDRAMs 72 and 74, so that the relation between the arrival times of a signal applied to the terminals 72-P, 74-P and 80-P, and a signal applied to the terminals 72-Q, 74-Q and 80-Q are equal for respective RDRAMs. In other words, for all DRAMs, the signal arrives first at the terminal P, then at the terminal Q after a predetermined time. Accordingly, it is possible to resolve the above problem of reduction in the margin of the setup/hold time or the like that arises when packages with identical terminal arrangement are to be loaded on both sides of the substrate, as shown in FIG. 5.

Since, however, the semiconductor chip to be mounted on the normal type package and on the mirrored type package has identical configuration, for mounting the semiconductor chip on the mirrored type package, the wirings for connecting terminals on the semiconductor chip (internal terminals) to the terminals on the package (external terminals) in the package, has to be made differently from those of the normal type package. For this reason, there may occur a case in which it is impossible to connect an internal terminal on the semiconductor chip to an external terminal on the package depending upon their positional relationship.

In FIG. 7 and FIG. 8 for describing such a situation, a semiconductor device 90-N in FIG. 7 is a normal type package while a semiconductor device 90-M in FIG. 8 is a mirrored type package. Here, the semiconductor devices 90-N and 90-M are CSPs. In FIG. 7, a small square represents a terminal on the semiconductor chip, and a circle represents a terminal of the package. The terminal on the semiconductor chip and the terminal of the package are connected electrically by a tape wiring 98. It should be mentioned that the technique of using a tape wiring for the wiring within the package is one feature of the CSP.

As shown in FIG. 7, signal input terminals 92-A, 92-B and 92-C on the semiconductor chip are connected by the tape wiring 98 to terminals A, B and C, respectively, of the package. a power terminal 94 is connected to a terminal V of the package by the tape wiring 98, and a ground terminal 96 is connected to a terminal G of the package by the tape wiring 98. Besides, NC is a nonconnected terminal which is not used.

When a semiconductor device 90-N with such a terminal arrangement is inverted on the plane of the paper with respect to the line connecting the terminals of 92-B, a semiconductor device 90-M having a terminal arrangement as shown in FIG. 8 is obtained. However, as mentioned in the above, the semiconductor chip itself to be mounted on a normal type package or a mirrored type package has identical configuration, so that there might appear locations at which connection of a terminal on the semiconductor chip and a terminal of the package is impossible.

FIG. 8 is a diagram showing such a situation in which, in the mirrored type package, connections between the terminal 92-A and the terminal A, and the terminal 92-C and the terminal C are impossible. In such a case, the manufacture of a mirrored type package is no longer possible. Nonetheless, if one wants to manufacture such a package, it is necessary to prepare separately semiconductor chips for normal type and for mirrored type, which means the necessity of manufacturing two kinds of semiconductor chips and a large increase in the manufacturing cost.

SUMMARY OF THE INVENTION

It is therefore an object of the present invention to resolve the above-mentioned problem and to provide semiconductor devices which facilitate the mounting on the normal type package as well as on a mirrored type package.

It is another object of the present invention to provide a module loaded with such semiconductor devices.

According to this invention, there is provided a semiconductor device equipped with a first and second signal terminals, a control terminal, and a switching means which connects the first signal terminal to a first internal wiring in response to the control terminal being in a first state, connects the first signal terminal to a second internal signal wiring different from the first internal signal wiring in response to the control terminal being in a second state different from the first state, and connects the second signal terminal to the first internal signal wiring.

Moreover, according to this invention, there is provided a semiconductor device equipped with a first and second signal terminals, a control terminal, and a switching means which transmits a signal supplied to the first signal terminal to a first internal signal wiring in response to the control terminal being in a first state, transmits a signal supplied to the first signal terminal to a second internal signal wiring different from the first internal signal wiring in response to the control terminal being in a second state different from the first state, and transmits a signal supplied to the second signal terminal to the first internal signal wiring.

Furthermore, according to this invention, there is provide a semiconductor device equipped with a first and second internal signal terminals, an internal control terminal, a first and second internal signal wirings, a firsts and second external signal terminals, a first and second external power terminals, a switching means which connects the first internal signal terminal to the first internal signal wiring when the internal control terminal is connected to the first external power terminal, connects the first internal signal terminal to the second internal signal wiring when the internal control terminal is connected to the second external power terminal, and connects the second internal signal terminal to the first internal signal wiring, a first external signal wiring which connects the first internal signal terminal to the first external signal terminal, and a second external signal wiring which connects the second internal signal terminal to the second external signal terminal.

Furthermore, according to this invention, there is provided a semiconductor device equipped with a first and second external power terminals, an external signal terminal, a first and second internal signal terminals, an internal control terminal, an internal signal wiring, a first external wiring which connects the first internal signal terminal to the external signal terminal, an element which blocks the connection of the second internal signal terminal and the external signal terminal, a switching means which connects the first internal signal terminal to the internal signal wiring when the internal control terminal and the first external power terminal are connected, and connects the second internal signal terminal to the internal signal wiring when the internal control terminal and the second external power terminal are connected, and a second external wiring which connects the control terminal and the first external power terminal.

In this way, even when the connection between an internal terminal on the semiconductor chip and an external terminal on the package is impossible or difficult, the function of the internal terminal on the semiconductor chip can be switched to the function of another internal terminal by means of the switching means, so that the connection can be made possible or facilitated.

Besides, according to this invention, there is provided a module which is equipped with a first and second semiconductor chips, a normal package mounted with the first semiconductor chip, a mirrored package mounted with the second semiconductor chip, and a substrate having the normal package mounted on one side and the mirrored package mounted on the other side, where each of the first and second semiconductor chips is equipped with a first and second signal terminals, a control terminal, and a switching means which connects the first signal terminal to a first internal signal wiring when the control terminal is connected to a first power supply, connects the first signal terminal to a second internal signal wiring different from the first internal signal wiring when the control terminal is connected to a second power supply different from the first power supply, and connects the second signal terminal to the first internal signal wiring, wherein the control terminal of the first semiconductor chip is connected to the first power supply in the normal package, and the control terminal of the second semiconductor chip is connected to the second power supply in the mirrored package.

Moreover, according to this invention there is provided a module which is equipped With a first and second semiconductor chips each of which is provided with a first and second internal signal terminals, a control terminal, and a switching means which connects the first internal signal terminal to a prescribed internal signal wiring in response to the application of a first voltage to the control terminal, and connects the second internal signal terminal to the prescribed internal signal wiring in response to the application of a second voltage different from the first voltage to the control terminal, a normal package mounted with the first semiconductor chip, a mirrored package mounted with the second semiconductor package, and a substrate loaded with the normal packages on one side and mounted with the mirrored packages on the other side, where the normal package is equipped with a first external power terminal to which is applied the first voltage a first external signal terminal, a means for connecting the first external power terminal and the control terminal of the first semiconductor chip, and a means, for connecting the first external signal terminal to the first internal signal terminal of the first semiconductor chip, and the mirrored package is equipped with a second external power terminal to which is applied the second voltage, a second external signal terminal which corresponds to the first external signal terminal of the normal package, a means for connecting the second external power terminal and the control terminal of the second semiconductor chip, and a means for connecting the second external signal terminal and the second internal signal terminal of the second semiconductor chip.

BRIEF DESCRIPTION OF THE DRAWINGS

The above-mentioned and other objects, features and advantages of the present invention will be more apparent from the following description taken in conjunction with the accompanying drawings, in which.

DESCRIPTION OF THE PREFERRED EMBODIMENTS

Figure 1:
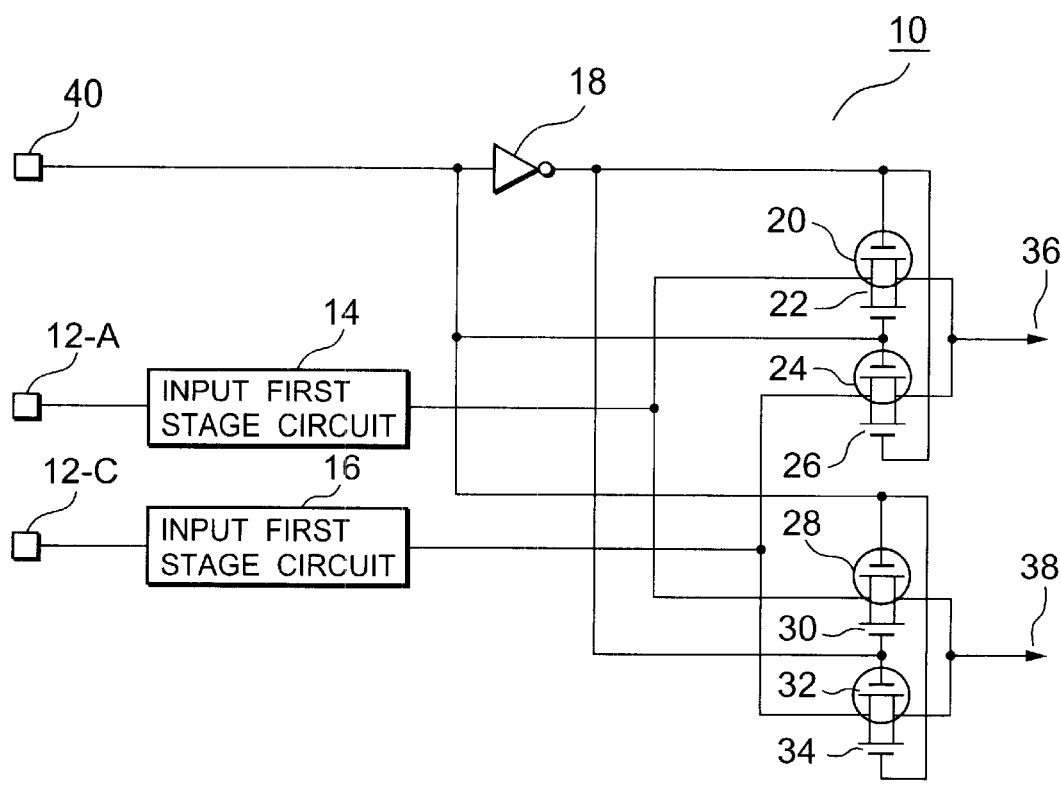
FIG. 1 is a diagram showing a switching circuit 10 built in a semiconductor device according to one embodiment of this invention.

FIG. 1 is a circuit diagram showing a switching circuit formed within a semiconductor device according to an embodiment of this invention. The switching circuit 10 switches the connection of a signal terminal 12-A provided on a semiconductor chip to a signal wiring 36 or to a signal wiring 38 inside the semiconductor chip, and switches the connection of a signal terminal 12-C to a signal wiring 36 or to a signal wiring 38.

What controls such a switching is the level of the voltage applied to a control terminal 40 on the semiconductor chip. Although it is not particularly limited, it is preferable to use a nonconnected terminal as the control terminal 40.

To describe the switching circuit 10 in more detail, it has a first transfer gate composed of a P-channel MOS transistor 20 and an N-channel MOS transistor 22, a second transfer gate composed of a P-channel MOS transistor 24 and an N-channel MOS transistor 26, a third transfer gate composed of a P-channel MOS transistor 28 and an N-channel MOS transistor 30, and a fourth transfer gate composed of a P-channel MOS transistor 32 and an N-channel MOS transistor 34. The continuity/noncontinuity of these gates is determined by the level of a signal applied to the control terminal 40.

Namely, when a high level voltage is applied to the control terminal 40, as a result of such a high level voltage and a low level voltage obtained by inverting it by an inverter 18, the first transfer gate and the fourth transfer gate go to a continuity state, and the second transfer gate and the third transfer gate go to noncontinuity state. In this case, an input signal supplied to the signal terminal 12-A and supplied through an input first stage circuit 14 is transmitted to the signal wiring 36 through the first transfer gate, and an input signal supplied to the signal terminal 12-C and supplied through an input first stage circuit 16 is transmitted to the signal wiring 38 through the fourth transfer gate.

In the meantime, when a low level voltage is applied to the control terminal 40, as a result of such a low level voltage and a high level voltage obtained by inverting it by the inverter 18, the second transfer gate and the third transfer gate go to continuity state, and the first transfer gate and the fourth transfer gate go to noncontinuity state. In this case, an input signal supplied to the signal terminal 12-A and supplied through the input first stage circuit 14 is transmitted to the signal wiring 38 through the third transfer gate, and an input signal supplied to the signal terminal 12-C and supplied through the input first stag circuit 16 is transmitted to the signal wiring 38 through the second transfer gate.

As in the above, the relation between the signal terminals 12-A and 12-C, and the signal wirings 36 and 38 can be switched readily by means of the switching circuit 10.

The input first stage circuits 14 and 16 are circuits which play the roles of input buffers and an input protective circuits so that they are not important in this invention. In addition, as to the control terminal 40 an input buffer is not necessary, but it is preferable to provide an input protection circuit.

Next, the advantages resulting from readily switching the functions of the signal terminals 12-A and 12-C using the switching circuit 10 will be described.

Figure 3:
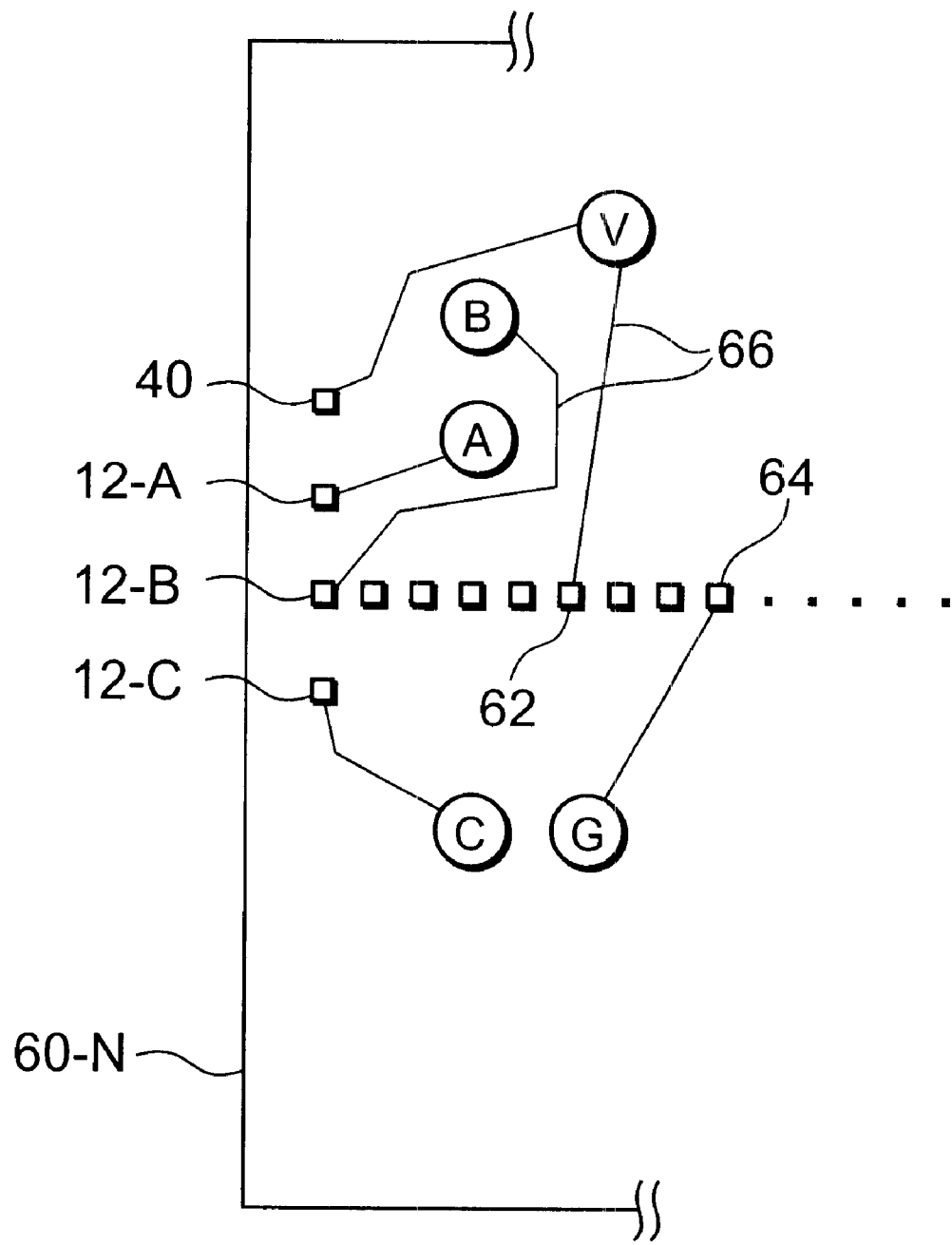
FIG. 3 is a diagram showing a semiconductor device 60-N of normal package type in one embodiment of this invention.
Figure 4:
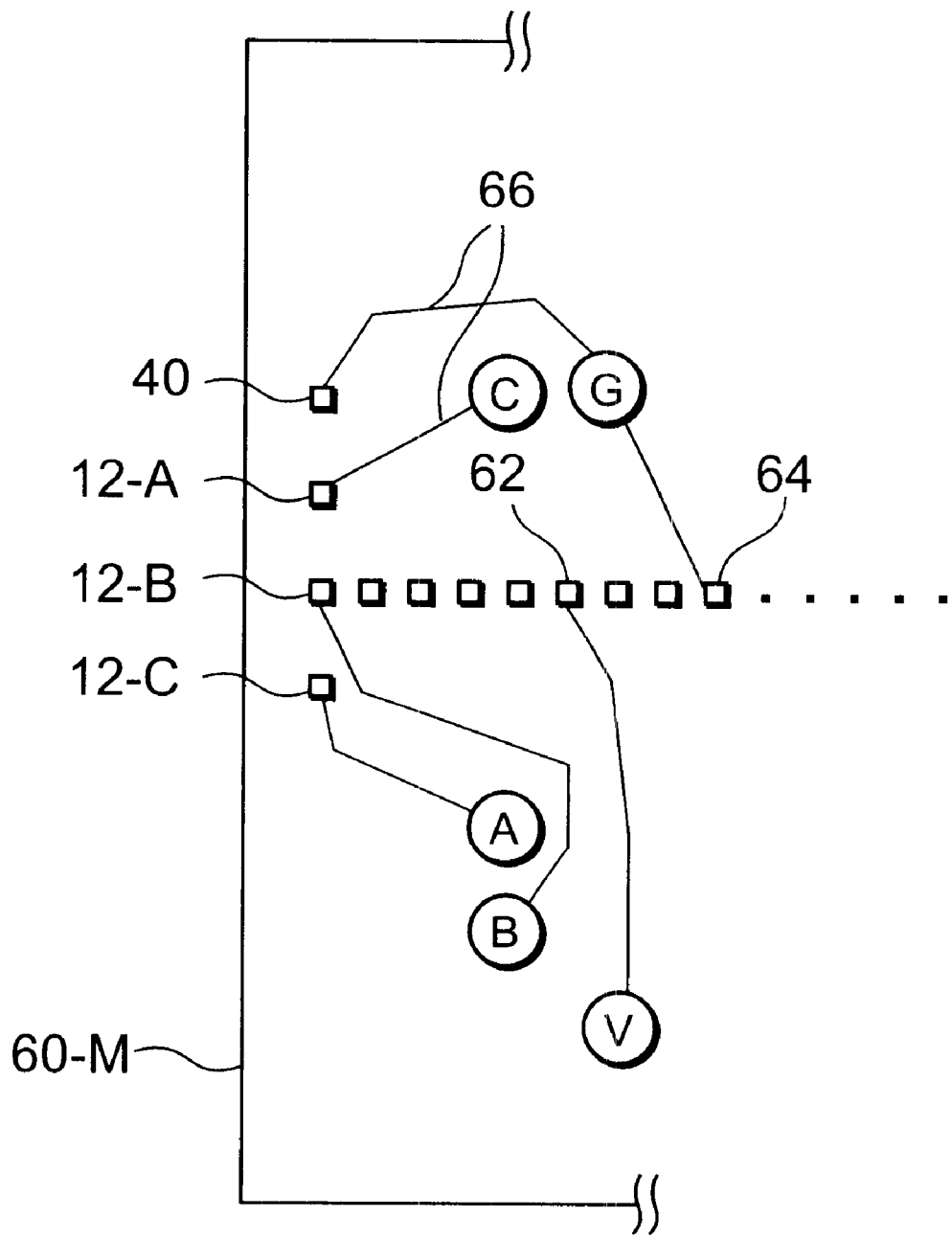
FIG. 4 is a diagram of a semiconductor device of mirrored type in one embodiment of this invention.
Figure 5:
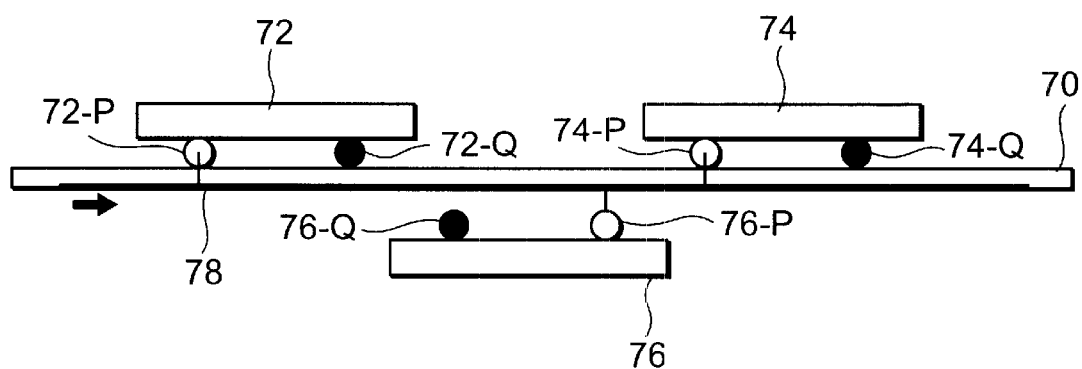
FIG. 5 is a diagram showing a module composed exclusively of normal packages.

In FIGS. 3 and 4 which illustrate the advantages, a semiconductor device 60-N shown in FIG. 3 is a normal type package and a semiconductor device 60-M shown in FIG. 4 is a mirrored type package. Here, the semiconductor devices 60-N and 60-M are assumed to be CSPs, but it is not necessary to limit the kind of the packages to the CSP. Accordingly, the packages maybe ball grid arrays (BGAs) or quad flat packages (QFPs) or other kind of packages.

In FIG. 3, a small square represents a terminal on the semiconductor chip, and a circle represents a terminal of the package. A terminal on the semiconductor chip and a terminal of the package are connected electrically by a tape wiring 66. Although the use of a tape wiring for the wiring in the package is a feature of the CSP, such a wiring is not limited to the tape wiring, and bonding wiring, for example, maybe employed in applying this invention to a QFP.

As shown in FIG. 3, signal input terminals 12-A, 12-B and 12-C on the semiconductor chip are connected to terminals A, B and C, respectively, of the package by the tape wiring 66, a power terminal 62 is connected to a power terminal V of the package by the tape wiring 66, and a ground terminal 64 is connected to a ground terminal G of the package by the tape wiring 66. Moreover, the control terminal 40 makes use of a nonconnected terminal which is not used in this invention. It should be noted that the control terminal 40 and the signal terminals 12-A and 12-C in FIG. 3 and FIG. 4 correspond to those terminals shown in FIG. 1, and that many signal terminals starting with the signal terminal 12-B are arranged between the signal terminal 12-A and the signal terminal 12-C so that wirings across some of these terminals are made impossible or difficult.

In the semiconductor device 60-N being a package of normal type, the package terminals A and C are located in the vicinity of the signal terminals 12-A and 12-C, respectively, so that it is easy to connect them. Accordingly, the signal terminals 12A and 12-C are connected to the package terminals A and C, respectively, along with the connection of the control terminal 40 to the power terminal V of the package. In this way, an input signal supplied to the package terminal A is transmitted to the signal wiring 36 through the signal terminal 12-A, and an input signal supplied to the package terminal C is transmitted to the signal wiring 38 through the signal terminal 12-C.

When the semiconductor device 60-N with such a terminal arrangement is inverted on the plane of the paper with respect to the line connecting the signal terminals of 12-B, a semiconductor device with terminal arrangement as shown in FIG. 4 is obtained. This represents a package in which some of the terminals on the semiconductor chip cannot be connected by the conventional technique to the terminals of the package. Namely, due to a large number of signal terminals arranged between the signal terminals 12-A and 12-C, wirings striding over these terminals are made impossible. More specifically, it is not possible to connect the signal terminal 12-A to the package terminal A, and to connect the signal terminal 12-C to the package terminal C.

However, according to this invention, even in such a case the problem can be resolved by connecting the control terminal 40 to the ground terminal G of the package, to switching the function of the signal terminal 12-A and the function of the signal terminal 12-C.

Namely, by connecting the control terminal 40 to the ground terminal G of the package, an input signal supplied to the signal terminal 12-A is transmitted to the signal wiring 38 and an input signal supplied to the signal terminal 12-C is transmitted to the signal wiring 36, so that it only needs to connect the signal terminal 12-A to the package terminal C and the signal terminal 12-C to the package terminal A.

As in the above, since the wiring for connecting the internal terminals on the semiconductor chip to the external terminals on the package can be made flexible by the use of the switching circuit 10, it is extremely effective in the manufacture0 of the mirrored package.

Figure 6:
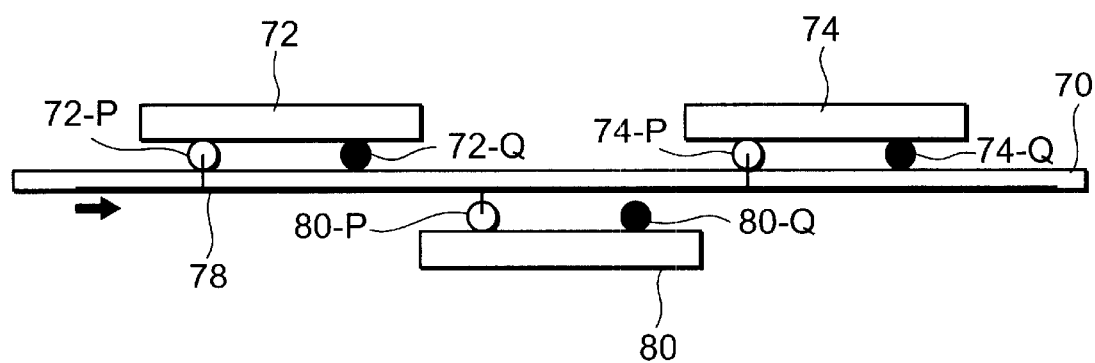
FIG. 6 is a diagram showing a module composed of normal packages and mirrored packages.
Figure 7:
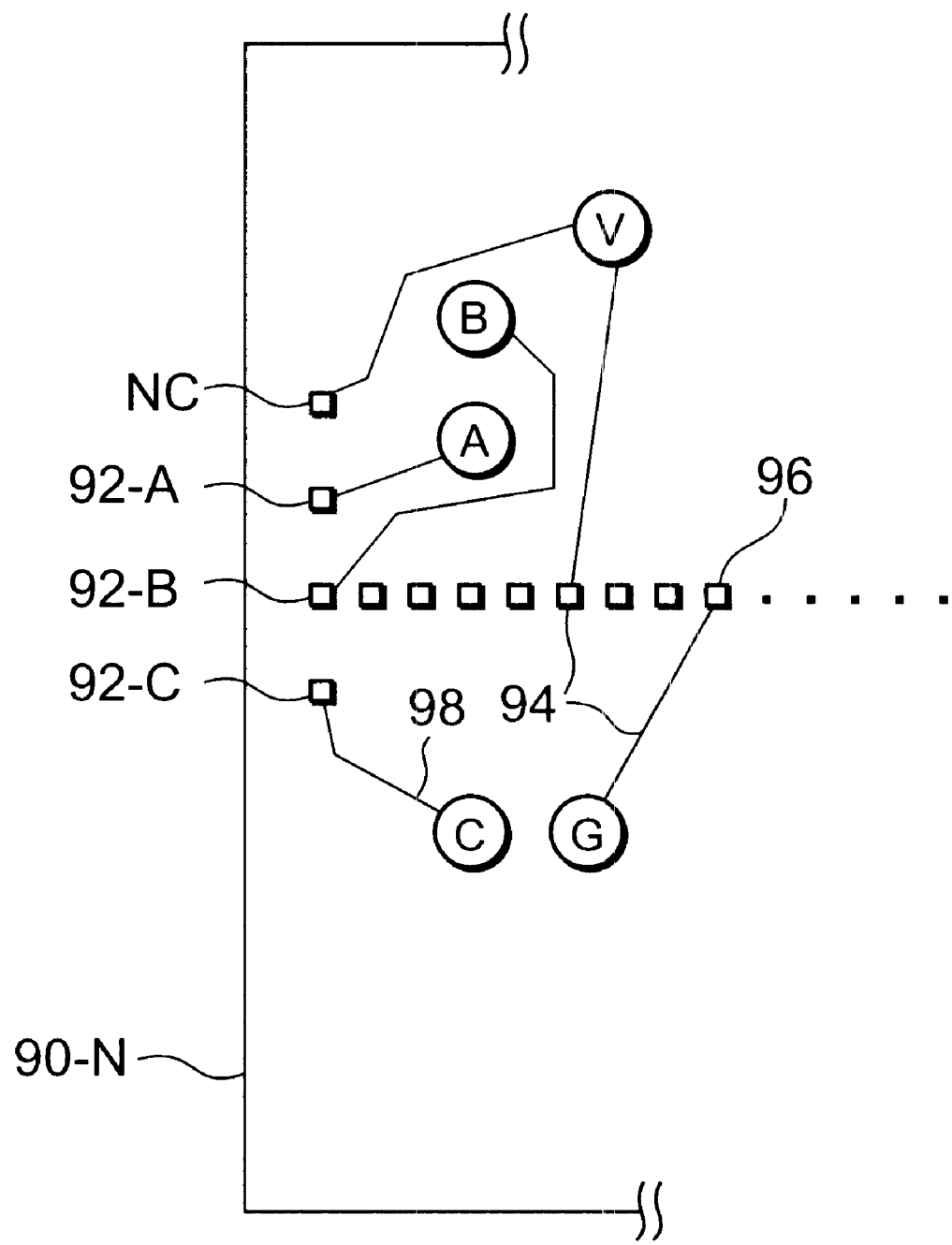
FIG. 7 is a diagram showing a conventional semiconductor device 90-N of normal package type.
Figure 8:
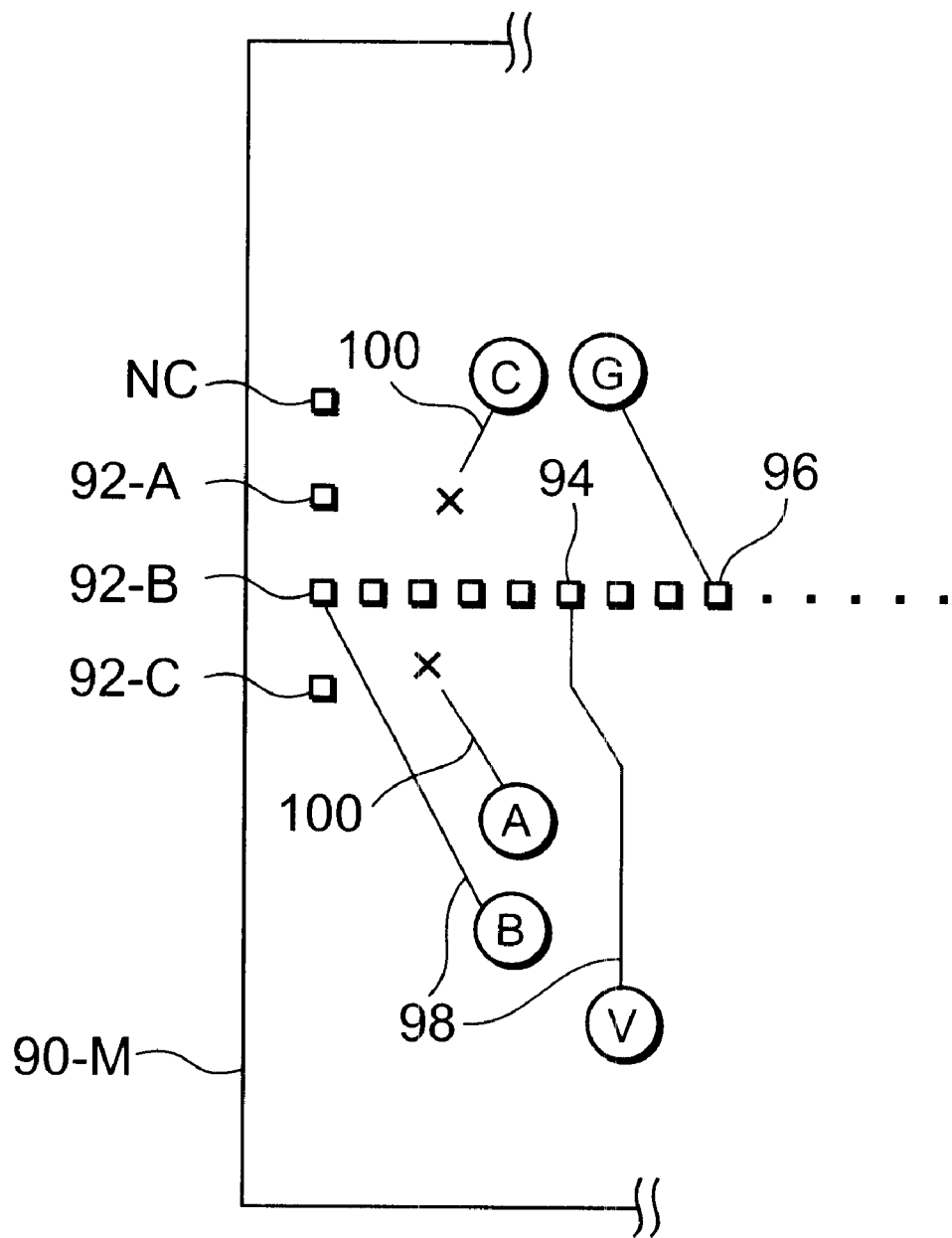
FIG. 8 is a diagram showing a conventional semiconductor device 90-M of mirrored package type.

The significance of adopting the mirrored package is as was described in connection with the conventional techniques. As shown in FIG. 6, in a module in which semiconductor devices are mounted on both sides of the substrate, packages of normal type are mounted on one side and packages of mirrored type are mounted on the other side in order to make the differences of signal arrival times at various terminals of the semiconductor devices mounted on one side are equal to the differences of signal arrival times at various terminals of the semiconductor devices mounted on the other side in order to prevent the reduction in the margins of the setup/hold and the like.

Figure 2:
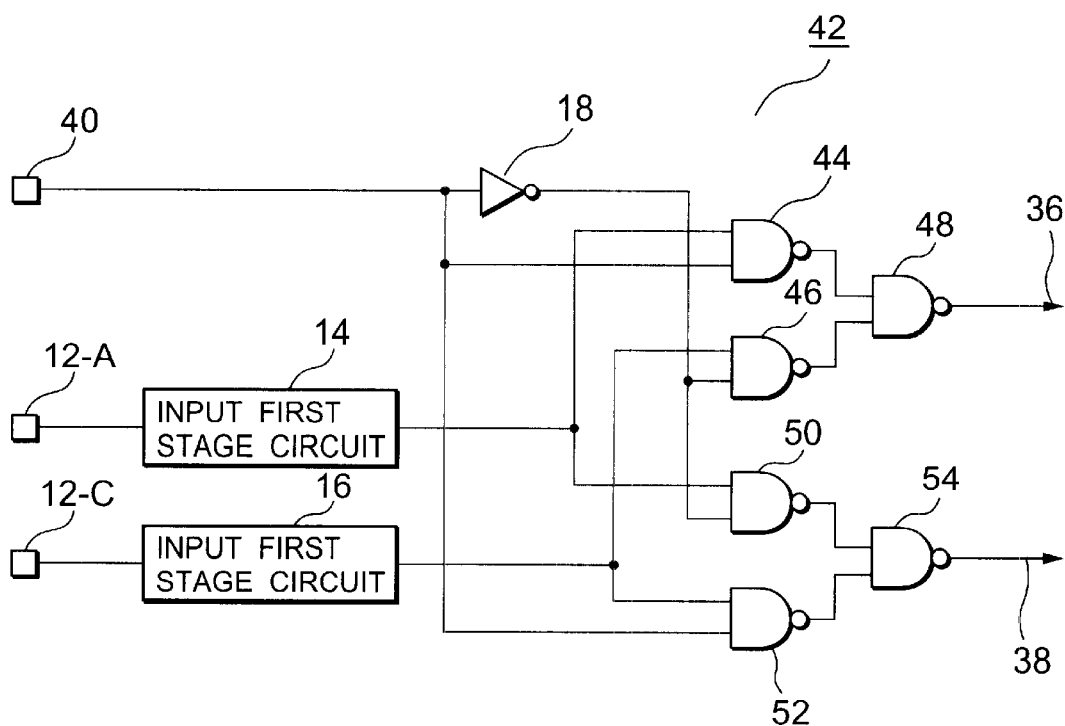
FIG. 2 is a diagram showing a switching circuit 42 built in a semiconductor device according to another embodiment of this invention.

Furthermore, as the switching circuit a circuit 42 as shown in FIG. 2 may be used. The switching circuit 42 is a circuit obtained by replacing the transfer gates in the switching circuit 10 by six NAND gates 44 to 54.

In the above, the mode of embodiment of this invention has been described, but this invention is not limited to that mode and various s kinds of other mode may be employed.

For example, in the above mode of embodiment of the invention the functions of two terminals are switched by the switching circuit, but the number of terminals to be switched is not limited to two and may be equal to or more than three. In this case, the switching is carried out not by the switching of the terminals but by, for example, the shift of the function of the terminals. Moreover, when the number of the terminals of switching object is three or more, three or more kinds of switching modes are conceivable so that such a situation can be dealt with by the use of two or more control terminals. Moreover, even when he number of terminals of switching object is two, the number of internal signal wirings to be the object of switching need not necessarily be two. For example, when a certain voltage is applied to the control terminal, one of the terminals may be connected to the internal signal wiring and the other terminal may be made to be an unused terminal, and when a voltage different from this is applied to the control terminal, the other terminal may be connected to the internal signal wiring and while one terminal is made to be unused. Furthermore, in the above mode of embodiment, the case of switching input terminals has been described, but this invention is not limited to this case, and some other terminals, for example, output terminals, input/output terminals or other kind of terminals may be made as the object of switching. Furthermore, in the above mode of embodiment, a power terminal or a ground terminal has been used as the switching signal for the terminals, but this invention is not limited to these cases and a reference signal, for example, may be utilized if such is available.

As described in the above, according to this invention, the mounting of a semiconductor device on a mirrored type package, which has not been possible according to the conventional techniques, becomes feasible.

What is claimed is:

1. A module comprising:
   a substrate;
   a first semiconductor device mounted on a front surface of said substrate and including a first semiconductor chip and a first package encapsulating said first semiconductor chip,
   said first semiconductor chip including:
      a first ground terminal;
      a first power terminal;
      first and second signal terminals;
      a first control terminal;
      first and second internal signal wirings; and
      a first switch circuit connecting said first signal terminal to said first internal signal wiring and said second signal terminal to said second internal signal wiring when said first control terminal is at a first logic level, and connecting said first signal terminal to said second internal signal wiring and said second signal terminal to said first internal signal wiring when said first control terminal is at a second logic level,
   said first package including:
      a second power terminal;
      a second ground terminal;
      first and second package terminals;
      a first line connecting said first and second power terminals to each other;
      a second line connecting said first and second ground terminals to each other;

a third line connecting said first signal terminal to said first package terminal;
    a fourth line connecting said second signal terminal to said second package terminal; and
    a fifth line connecting said first control terminal to said second power terminal to supply said first logic to said first control terminal so that said first and second signal terminals are connected respectively to said first and second internal signal wirings via said first switch circuit; and
  a second semiconductor device mounted on a rear surface of said substrate and including a second semiconductor chip and a second package encapsulating said second semiconductor chip,
  said second semiconductor chip including:
    a third ground terminal
    a third power terminal;
    third and fourth signal terminals;
    a second control terminal;
    third and fourth internal signal wirings; and
    a second switch circuit connecting said third signal terminal to said third internal signal wiring and said fourth signal terminal to said fourth internal signal wiring when said second control terminal is at said first logic level, and connecting said third signal terminal to said fourth internal signal wiring and said fourth signal terminal to said third internal signal wiring when said second control terminal is at said second logic level,
  said second package including:
    a fourth power terminal;
    a fourth ground terminal;
    third and fourth package terminals;
    a sixth line connecting said third and fourth power terminals to each other;
    a seventh line connecting said third and fourth ground terminals to each other;
    an eighth line connecting said third signal terminal to said third package terminal;
    a ninth line connecting said fourth signal terminal to said fourth package terminal; and
    a tenth line connecting said second control terminal to said fourth ground terminal to supply said second logic to said second control terminal so that said third and fourth signal terminals are connected respectively to said fourth and third internal signal wirings via said second switch circuit.

2. The module as claimed in claim 1, wherein said first package is devoid of an electrical path between said first control terminal of said first semiconductor chip and said second ground terminal of said first package, and said second package is devoid of an electrical path between said second control terminal of said second semiconductor chip and said third power terminal of said second package.

3. The module as claimed in claim 1, wherein said first signal terminal is arranged between said first control terminal and said second signal terminal, and said third signal terminal is arranged between said second control terminal and said fourth signal terminal, said second power terminal being arranged closer to said first package terminal than said second package terminal, and said fourth ground terminal being arranged closer to said fourth package terminal than said third package terminal.

* * * * *